(12) United States Patent
Lee et al.

(10) Patent No.: US 6,362,530 B1
(45) Date of Patent: *Mar. 26, 2002

(54) MANUFACTURING METHODS AND CONSTRUCTION FOR INTEGRATED CIRCUIT PACKAGES

(75) Inventors: Shaw Wei Lee, Cupertino; Hem P. Takiar, Fremont, both of CA (US)

(73) Assignee: National Semiconductor Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/056,074

(22) Filed: Apr. 6, 1998

(51) Int. Cl.[7] ............................................. H01L 23/48
(52) U.S. Cl. ...................................... 257/778; 257/704
(58) Field of Search ............................ 257/704, 778, 257/777

(56) References Cited

U.S. PATENT DOCUMENTS 5,777,386 A * 7/1998 Higashi et al. ............ 257/737
5,789,810 A * 8/1998 Gross et al. ................ 257/704

* cited by examiner

*Primary Examiner*—Carl Whitehead, Jr.
*Assistant Examiner*—Roy Potter
(74) *Attorney, Agent, or Firm*—Beyer Weaver & Thomas, LLP

(57) ABSTRACT

A method of forming an integrated circuit package includes providing a flip chip integrating circuit die having a first plurality of contacts for electrically connecting the die to other elements. A second plurality of contacts for electrically connecting the integrated circuit package to external elements is also provided. A substrate for supporting the flip chip die and the second plurality of contacts is initially prepared. The substrate includes a connecting arrangement for electrically connecting the first plurality of contacts on the die to the second plurality of contacts. The method includes the step positioning the flip chip integrated circuit die and the second plurality of contacts on the substrate. With the flip chip die and the second plurality of contacts in position, both the first plurality of contacts on the flip chip die and the second plurality of contacts are simultaneously attached to the substrate thereby electrically connecting the die and the second plurality of contacts to the substrate. In one embodiment, a metal cap is attached to the integrated circuit package to cover and protect the die. In this embodiment, the metal cap may be used to provide a direct thermal path from the die to the external element to which the integrated circuit package is to the connected. An additional heat sink may also be attached to the package.

11 Claims, 2 Drawing Sheets

MANUFACTURING METHODS AND CONSTRUCTION FOR INTEGRATED CIRCUIT PACKAGES

BACKGROUND OF THE INVENTION

The present invention relates generally to integrated circuit packages and more specifically to methods of manufacturing integrated circuit packages including flip chip integrated circuit die attached to a substrate.

In the integrated circuit packaging industry, there is continuous pressure to reduce the cost of manufacturing integrated circuit package. To accomplish this, a wide variety of package designs and assembly methods have been developed. One particular type of package currently being produced is referred to as a flip chip ball grid array package. This type of package can provide a very small, relatively cost effective package sometimes referred to as a flip chip or chip scale package. However, because of the very large numbers of this type of package currently being produced, and because of the competitive nature of the integrated circuit package industry, even a slight reduction in the costs of producing this type of package can provide a substantial advantage. Therefore, it is desirable to provide an improved, less costly method of manufacturing integrated circuit packages such as flip chip ball grid array packages.

For comparative purposes, a current method of manufacturing a slip chip ball grid array package, designated by reference numeral 100, will be briefly described with reference to FIGS. 1A–D. As illustrated in FIG. 1A, package 100 includes an overall substrate 102 and a flip chip integrated circuit die 104. Die 104 includes a plurality of contacts 106 for electrically connecting die 104 to substrate 102. Typically, contacts 106 are provided in the form of solder balls.

Overall substrate 102 includes a stiffener 108 and an interconnecting substrate 110. In this case, interconnecting substrate 110 is a conventional flex tape substrate such as a polyimide tape substrate. Stiffener 108 is provided as a layer of metal material having a window punched through its center to provide an open space for mounting die 104 to flex tape substrate 110. Once stiffener 108 has been punched, it is attached to interconnecting substrate 110 as shown in FIG. 1A. With overall substrate 102 assembled, it is positioned and prepared to being the assembly of package 100. This is accomplished by fluxing interconnecting substrate 110 so that the contact points on interconnecting substrate 110, indicated by reference numeral 112, are ready to receive contacts 106 of die 104 as illustrated in FIG. 1A.

As also shown in FIG. 1A, the next step involved in manufacturing integrated circuit package 100 is the step of positioning die 104 on substrate 102 using a conventional vacuum pickup tool. Die 104 is then attached to substrate 102 by reflowing solder ball contacts 106. After die 104 is attached to substrate 102, the assembly is typically cleaned to remove any excess flux. As illustrated in FIG. 1B, and if desired, die 104 may be underfilled at this point in order to stabilize and protect the connections between die 104 and interconnecting substrate 110. This is accomplished using any conventional underfill technique.

Referring now to FIG. 1C, the next step of the prior art method being described involves attaching a plurality of solder ball contacts 114 for connecting integrated circuit package 100 to external elements. As shown in FIG. 1C, package 100 is turned over and fluxed so that the contact points on interconnecting substrate 110, indicated by reference numeral 116, are ready to receive solder ball contacts 114. In a manner similar to that describe above for die 104, solder ball contacts 114 are picked up and positioned on interconnecting substrate 110 using a conventional vacuum pickup tool. Once properly positioned on interconnecting substrate 110, contacts 114 are attached to package 100 by reflowing solder ball contacts 114. After contacts 114 are attached to package 100, the assembly is typically cleaned to remove any excess flux remaining on the package. This step of cleaning the assembly completes the basic assembly of the package if additional heat dissipating elements are not required.

Although the above described method results in a useful package, it is desirable to provide this type of package at the lowest possible cost. The present invention provides a method of manufacturing a flip chip ball grid array package which eliminates some of the steps require to produce the package. By reducing the number of steps required to manufacture the package, the cost of producing the package may be reduced.

In certain situations in which additional heat dissipating characteristics are required, an additional heat sink 118 may be attached to the top of prior art package 100 as illustrated in FIG. 1D. Although this configuration improves the heat dissipating characteristics of the package, it may not provide sufficient heat dissipating characteristics. Accordingly, it is desirable to provide a package configuration having even greater thermal dissipating characteristics than the above described configuration. The present invention provides arrangements and methods of producing integrated circuit packages which are capable of improved heat dissipating characteristics compared to the prior art configuration described above.

SUMMARY OF THE INVENTION

As will be described in more detail hereinafter, a method forming an integrated circuit package is disclosed herein. The method includes the step of providing a flip chip integrating circuit die having a first plurality of contacts for electrically connecting the die to other elements. A second plurality of contacts for electrically connecting the integrated circuit package to external elements is also provided. Initially, a substrate for supporting the flip chip die and the second plurality of contacts is prepared. The substrate includes a connecting arrangement for electrically connecting the first plurality of contacts on the die to the second plurality of contacts. With the substrate prepared, the flip chip integrated circuit die and the second plurality of contacts are positioned on the substrate. Wit the flip chip die and the second plurality of contacts in position, both the first plurality of contacts on the flip chip die and the second plurality of contacts are simultaneously attached to the substrate thereby electrically connecting the die and the second plurality of contacts to the substrate.

In one embodiment, the first and the second plurality of contacts are solder balls. In this embodiment, the step of attached both the first plurality of contacts on the flip chip die and the second plurality of contacts to the substrate includes the step of reflowing the solder balls.

In another embodiment, a vacuum pickup tool is used to pick up the die and the second plurality of contacts and to position the die and the second plurality of contacts on the substrate. The vacuum pickup tool includes a pickup head designed to pick up both the die and the second plurality of contacts and simultaneously position the die and the second plurality of contacts on the substrate.

In another embodiment, the substrate includes a heat conducting stiffener that supports the connecting arrangement on a first surface of the stiffener. Wit this configuration, the first plurality of contacts and the heat conducting stiffener provide a thermal path for dissipating heat away from the die. In one version of this embodiment, the connecting arrangement includes a layer of electrically insulating material deposited on the first surface of the stiffener and a pattern of electrically conductive traces formed on the insulating layer. These traces electrically connect the first plurality of contacts on the die to the second plurality of contacts. Alternatively, the connecting arrangement may include a thin flex tape substrate supported on the first surface of the stiffener. In order to further improve the heat dissipating characteristics of the package, a heat sink may be attached to a second surface of the stiffener.

In another embodiment of the method, the method further includes the step of attaching a metal cap to the integrated circuit package after the flip chip die has been attached to the substrate. The metal cap is attached to the integrating circuit package such that the metal cap covers and protects the flip chip die. The metal cap may be attached to the integrated circuit package using any conventional attachment method. In one version of this embodiment, the metal cap is glued to the die. This provides good thermal contact between the metal cap and the die. Alternatively, a thermal grease maybe used to improve the thermal contact between the metal cap and the die. Preferably, the metal cap is attached to the integrated circuit package such that a bottom lowermost surface of the metal cap is substantially in a common plane with a plane extending through a plurality of lowermost points on the second plurality of contacts. This configuration allows the integrated circuit package to be attached to an external element with the bottom lowermost surface of the metal cap and the lowermost points of the second plurality of contacts all providing attachment points to the external element. The connection between the bottom lowermost surface of the metal cap and the external element provides a direct thermal path for dissipating heat away from the die.

An integrated circuit package manufactured using the methods of the present invention is also disclosed. The integrated circuit package includes a flip chip integrated circuit die having a first plurality of contacts for electrically connecting the die to other elements. A second plurality of contacts provides an arrangement for electrically connecting the integrated circuit package to external elements. The die and the second plurality of contacts are attached to a first surface of a substrate. The substrate has a connecting arrangement for electrically connecting the first plurality of contacts on the die to the second plurality of contacts. A metal cap is attached to the integrated circuit package such that the metal cap covers and protects the die. The metal cap is positioned such that a bottom lowermost surface of the metal cap is substantially in a common plane with a plane extending through a plurality of lowermost points on the second plurality of contacts. This configuration allows the integrated circuit package to be attached to an external element with the bottom lowermost surface of the metal cap and the lowermost points of the second plurality of contacts all providing attachment points to the external element. The connection between the bottom lowermost surface of the metal cap and the external element provides a direct thermal path for dissipating heat away from the die.

BRIEF DESCRIPTION OF THE DRAWINGS

The features of the present invention may best be understood by reference to the following description of the presently preferred embodiments together with the accompanying drawings.

DETAILED DESCRIPTION OF THE PREFERRED EMBODIMENTS

An invention is herein described for providing a method of manufacturing a flip chip ball grid array integrated circuit package or a chip scale integrated circuit package. In the following description, numerous specific details are set forth for specific embodiments in order to provide a thorough understanding of the present invention. However, in view of this description, it will be obvious to one skilled in the art that the present invention may be embodied in a wise variety of specific configurations. Also, well known integrated circuit package manufacturing processes such as the production of integrated circuit package substrates, the forming of solder ball contacts, the underfilling of flip chip die attached to a substrate, and other such conventional integrated circuit manufacturing processes will not be described in detail in order not to unnecessarily obscure the present invention.

Figure 1A:
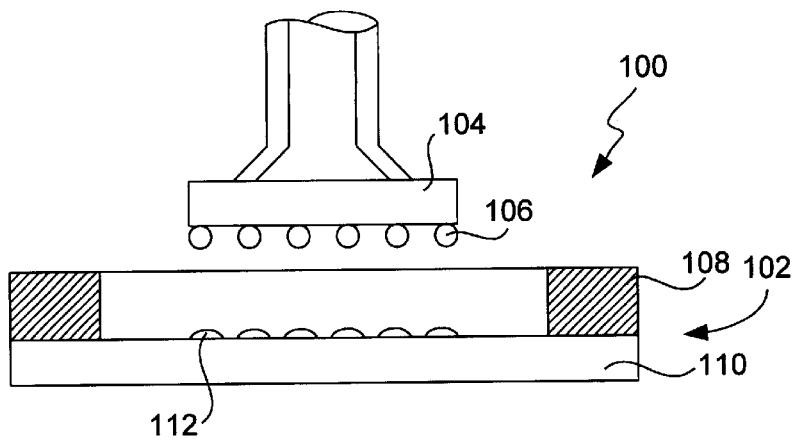
FIG. 1A is a diagrammatic cross sectional view of an integrated circuit package during the step of attaching a flip chip die to a substrate using a prior art method of assembling the package.
Figure 1B:
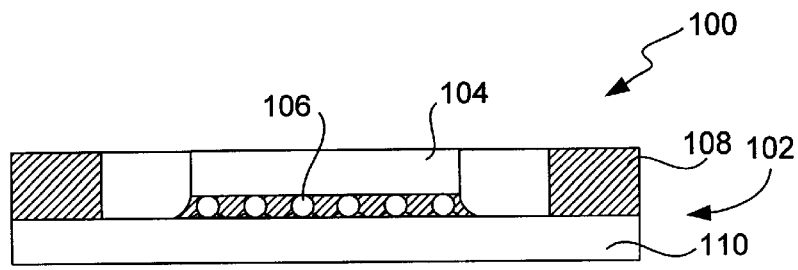
FIG. 1B is a diagrammatic cross sectional view of the package of FIG. 1A after the step of underfilling the flip chip die.
Figure 1C:
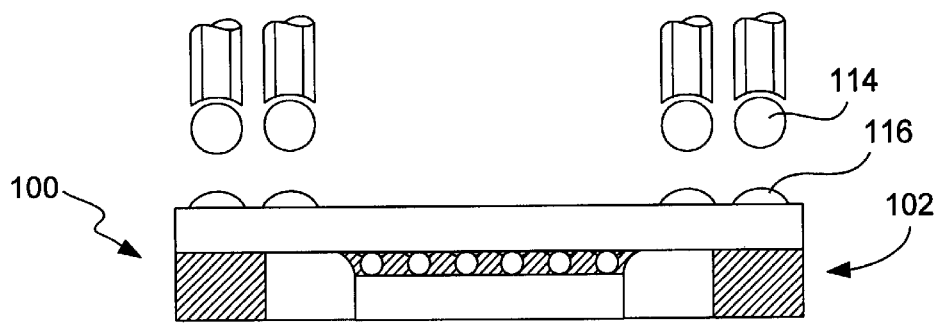
FIG. 1C is a diagrammatic cross sectional view of the package of FIG. 1B during the step of attaching a plurality of solder contacts to the substrate.
Figure 1D:
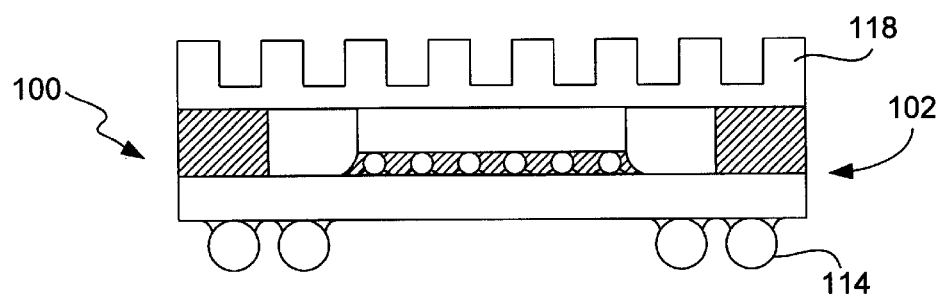
FIG. 1D is a diagrammatic cross sectional view of the package of FIG. 1C after the step of attaching a heat sink to the substrate.
Figure 2A:
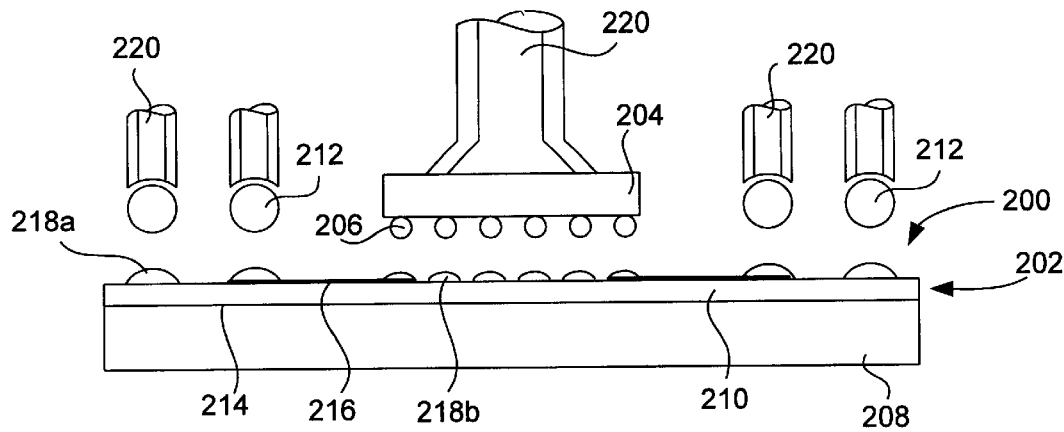
FIG. 2A is a diagrammatic cross sectional view illustrating the step of attaching a flip chip die and a plurality of contacts to a substrate using one embodiment of a method in accordance with the invention for manufacturing an integrated circuit package.

Referring initially to FIGS. 2A–D, an integrated circuit package 200 manufactured in accordance with the invention will be described. For illustrative purposes, a package similar to package 100 will be described. As shown in FIG. 2A, integrated circuit package 200 includes a substrate 202 and a flip chip integrated circuit die 204 similar to substrate 102 and flip chip die 104 described above. Die 204 includes a plurality of contacts 206 for electrically connecting die 204 to substrate 202. Contacts 206 may be provided in the form of solder balls, solder columns, or any other conventionally available contacts which are attached to die 204 using any conventional method.

In the embodiment shown, overall substrate 202 includes a stiffener 208 and an interconnecting substrate 210. In this embodiment, stiffener 208 is provided as a layer of metal material such as aluminum or copper sheet material. Also, stiffener 208 does not have a window punched through its center as was described above for package 100. Instead, stiffener 208 is a solid layer of material (e.g. copper or aluminum) that fully supports interconnecting substrate 210.

Because stiffener 208 is provided as a solid layer of material, it provides a more rigid support for interconnecting substrate 210. As will be described in for detail hereafter, this more rigid support allows a wider variety the interconnecting substrate arrangements to be used for interconnecting substrate 210. Another advantage of this configuration is that it eliminates the need for the step of punching the window into the stiffener as described above for stiffener 108. Therefore, an overall substrate 202 of this configuration may be provided at a lower cost than that described above for overall substrate 102.

Although stiffener 208 is described as not having a window punched through it, this is not a requirement of the invention. Instead, any conventional stiffener may be used. In fact, the present invention is not limited to the specific configuration described above. Instead, any conventional substrate may be used to providing overall substrate 202. The invention would equally apply to all of these configurations regardless of the specific construction of overall substrate 202. For example, overall substrate 202 may take the form of an interconnecting board that performs the functions of both a stiffener and an interconnecting substrate.

Package 200 also includes an array of contacts 212 for electrically connecting package 200 to external elements. Contacts 212 may be any conventional contacts such as solder balls, solder columns, or any other readily available contacts. For illustrative purposes, contacts 212 are shown in the figures as solder balls.

In an initial step of manufacturing integrated circuit package 200 in accordance with the invention, overall substrate 202 is prepared for assembly. In the embodiment shown in FIG. 2A, interconnecting substrate 210 is attached to, or formed on, stiffener 208. Interconnecting substrate 210 provides a connecting arrangement for electrically connecting contacts 206 of flip chip die 204 to associated ones of contacts 212. As mention above, interconnecting substrate 210 may be provided as a flex tape substrate such as a polyimide flex tape substrate or any other conventional interconnecting substrate.

Alternatively, since stiffener 208 is provided as a solid layer of metal material in the embodiment being described, interconnecting substrate 210 may be formed directly onto stiffener 208. For example, in one embodiment, interconnecting substrate 210 may be provided by initially forming a thin electrically insulating layer 214, such as an oxide layer, directly on stiffener 208. With insulating layer 214 in place, a pattern of electrically conductive traces, indicated by reference numeral 216, is deposited or formed on insulating layer 214. Traces 216 provide the connecting arrangement for electrically connecting contacts 206 on die 204 to contacts 212. This configuration provides a very cost effective overall substrate 202 that has excellent heat dissipating characteristics due to the very low thermal resistance that may be achieved using the thin insulating layer 214.

With overall substrate 202 assembled, it is positioned and prepared to being the assembly package 200. This is accomplished by fluxing overall substrate 202 so that the contact points on interconnecting substrate 210, indicated by reference numerals 218a and 218b, are ready to receive contacts 206 of die 204 and contacts 212 as illustrated in FIG. 2A. In accordance with the invention, all of the contact points on interconnecting substrate 210 are prepared during this step. That is, both the contact points that receive contacts 206 of die 204 (indicated by contact points 218a) and the contact points that receive contacts 212 (indicated by contact points 218b) are prepared.

In accordance wit the invention, the next step involved in manufacturing integrated circuit package 200 is the step of positioning contacts 206 of die 204 and contacts 212 on substrate 202 so that they may be simultaneously attached to substrate 202. This may be accomplished using conventional vacuum pickup equipment that includes a specifically configured vacuum pickup head 220 as shown in FIG. 2A. In the case in which vacuum pickup head 220 is used, vacuum head 220 includes multiple pickup points for simultaneously holding both die 204 and contacts 212. Although a vacuum pickup head is described as being used to position the die and the contacts on the substrate, this is not a requirement of the invention. Instead, it should be understood that the invention would equally apply regardless of the specific method in which the die and the contacts are positioned on the substrate so long as the die and the contacts are able to the simultaneously attached to the substrate.

Although vacuum pickup head 220 is illustrated as simultaneously holding both die 204 and contacts 212, die 204 and contacts 212 may be picked up at different times. For example, pickup head 220 may be used to initially pick up die 204, and then move on to pick up contacts 212. Alternatively, contacts 212 maybe picked up first. In one preferred embodiment, contacts 212 may be collected and arranged in a stencil in order to facilitate the easy picking up of the contacts. Although these specific examples given, it should be understood that the invention would equally apply regardless of the order and manner in which the die and the contacts are picked up so long as they are positioned on substrate 202 so that they may be simultaneously attached to substrate 202.

In accordance with the invention, and as illustrated in FIG. 2A, die 204 and contacts 212 are simultaneously attached to substrate 202. In the example shown, contacts 206 on die 204 and contacts 212 are all solder balls. Therefore, contacts 206 on die 204 and contacts 212 are all attached to substrate 202 by simultaneously reflowing solder ball contacts 206 and solder ball contacts 212. Although contacts 206 and contacts 212 are described as solder balls that are attached by reflowing the solder, this is not a requirement of the invention. Instead, contacts 206 and 212 may be any conventional contacts and these contacts maybe attached using any conventional attaching method. The present invention would equally apply regardless of the type of contacts used and regardless of the method of attaching the contacts so long as the flip chip die and the contacts for connecting the package to external elements are simultaneously attached to the substrate.

Figure 2B:
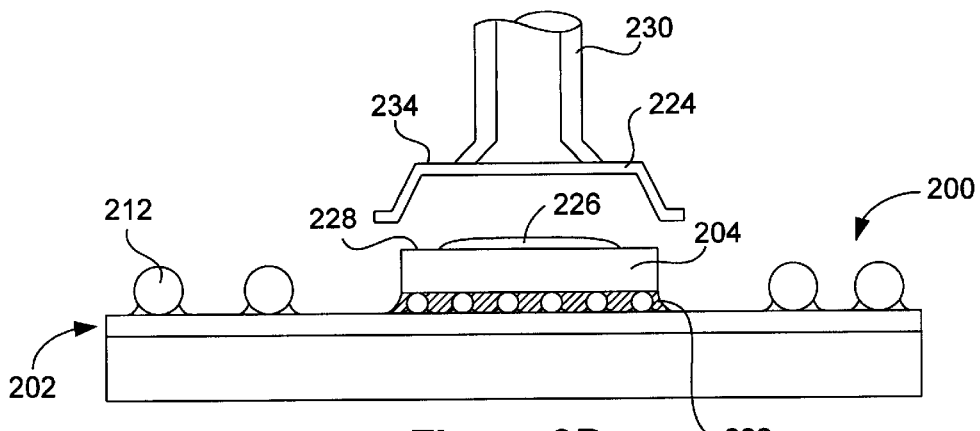
FIG. 2B is a diagrammatic cross sectional view of the package of FIG. 2A during the step of attaching a metal cap to the substrate.

After die 204 and contacts 212 are attached to package 200, the assembly is typically cleaned to remove any excess flux remaining on the package. As described in the background for package 100, and if desired, die 204 may be unfilled with an underfill material 222 at this point in order to stabilize and protect the connections between die 204 and interconnecting substrate 210. This is accomplished using ay conventional underfill technique and is illustrated in FIG. 2B. These steps of cleaning the assembly and underfilling the die complete the basic assembly of the package if additional heat dissipating elements are not required. By simultaneously attaching die 204 and contacts 212 in accordance with the invention, several steps in the assembly of the package may be eliminated compared to the conventional assembly method described in the background. These steps that maybe eliminated include (i) cleaning the flux after the die is attached and before the contacts that are used to connect the package to external elements are attached, (ii) fluxing the substrate a second time prior to attaching the contacts, and (iii) reflowing the solder a second time in order to attach the contacts to the substrate. By eliminating these process steps, the cost of producing the assembly may be reduced compared to conventional methods thereby providing a more cost effective package.

In certain situations in which additional heat dissipating characteristics are required, the methods of the present invention may include additional process steps. In one embodiment illustrated in FIGS. 2B and 2C, a metal cap 224 may be attached to package 200 in order to protect die 202 and improve the heat dissipating characteristics of the package. As show in FIG. 2B, a thermal grease 226 may be applied to a top surface 228 of die 204. This thermal grease improves the thermal transfer from die 204 to metal cap 224. As illustrated in FIG. 2B, metal cap 224 is then positioned on package 200 using a conventional vacuum pickup tool 230 or any other appropriate method. With metal cap 224 in place, metal cap 224 is attached to package 200 using any conventional attaching method including but not limited to clipping the cap to the package, gluing the cap to the package, soldering the cap to the package, bolting the cap to the package, or any other appropriate attaching technique.

Although the method has been described as using thermal grease to improve the thermal transfer from die 204 to metal cap 224, this is not a requirement of the invention. Instead, metal cap 224 may be attached without including the use of thermal grease. Alternatively, metal cap 224 may be glued to top surface 228 of die 204 as illustrated by adhesive layer 232 in FIG. 2C. All of these various configurations would equally fall within the scope of the invention regardless of the manner in which metal cap 224 is attached to package 200.

Figure 2C:
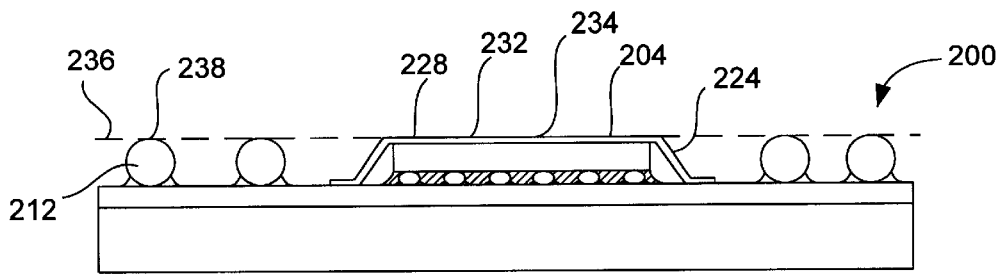
FIG. 2C is a diagrammatic cross sectional view of the package of FIG. 2B after the step of attaching the metal cap to the substrate.
Figure 2D:
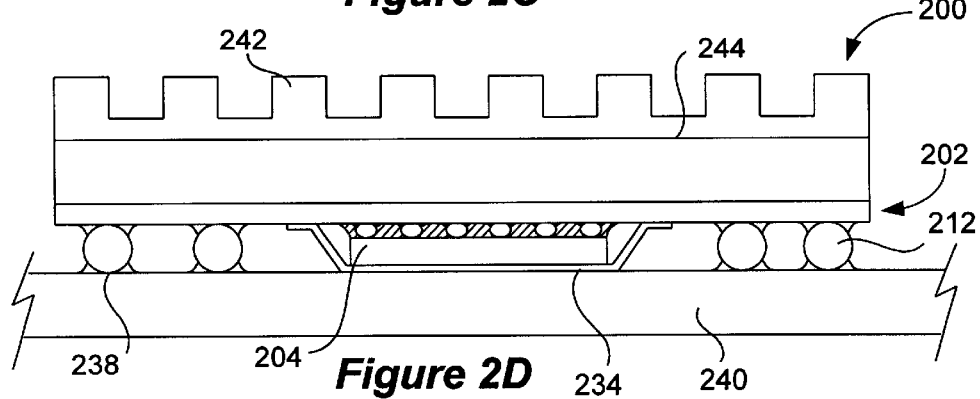
FIG. 2D is a diagrammatic cross sectional view of the package of FIG. 2C after the step of attaching a heat sink to the substrate.

In the embodiments illustrated in FIGS. 2B–2D, metal cap 224 includes an exterior surface 234. In accordance with one aspect of the invention, exterior surface 234 is positioned such that it lies in a common plane with a plane 236 (shown in FIG. 2C) that extends through the outermost points of contacts 212. These outermost points are indicated by reference numeral 238 and are the points on contacts 212 that end up being the lowermost points of contacts 212 when package 200 is flipped over in order to be attached to external elements such as a printed circuit board 240 as illustrated in FIG. 2D. The stiffener 208 and the metal cap 224 can be (and typically should be) connected thereby creating a ground plane that encapsulates the die to provide a high level of RFI/EMI shielding to the die.

With the above described configuration, package 200 may be attached to an external element such as printed circuit board 240 with the lowermost points 238 of contacts 212 and exterior surface 234 of metal cap 224 all being in direct contact with the printed circuit board. This allows metal cap 224 to be directly attached to a heat dissipating pad on the printed circuit board. The heat dissipating pad of the printed circuit board may be a power plane, aground plane, or any other surface designed to dissipate heat away from die 204 through printed circuit board 240. Additionally, exterior surface 234 of metal cap 224 may be soldered to the heat dissipating pad of the printed circuit board in order to provided a direct thermal path from die 204 through metal cap 224 and into the printed circuit board.

Because of the direct thermal path provided by metal cap 224, the above described configuration provides a package having excellent heat dissipating capabilities. However, in situations that require even greater heat dissipating characteristics, a heat sink 242 may also be attached to package 200 as illustrated in FIG. 2D. In the embodiment shown, heat sink 242 is attached to the surface of substrate 202 opposite the surface of substrate 202 on which die 204 and contacts 212 are attached. This surface is indicated by surface 244 in FIG. 2D.

Wit heat sink 242 attached to the package, two thermal paths for dissipating heat away from die 204 are provided. The first path expands from die 204 through metal cap 224 and directly into printed circuit board 240. The second path runs from die 204 through contacts 206 and substrate 202, and into heat sink 242 where heat is dissipated to the ambient air surrounding heat sink 242. The combination of these two thermal paths provides a package having excellent heat dissipating capabilities that can handle the very large amounts of heat that may generated by high power integrated circuit die.

Although only a few specific embodiments of an integrated circuit package in accordance with the invention have been described in detail, it should be understood a wide variety of different packages may be manufactured using the method the present invention. All of these various packages would equally fall within the scope of the invention so long as the flip chip die and the associated contacts for connecting the package to external elements are simultaneously attached to the substrate. Also, although only a few specific embodiments of methods of the invention have been described, it is to be understood that the methods of the present invention may be embodied in a wide variety of alternative forms and still remain within the scope of the invention. Any of these various embodiments would equally fall within the scope of the invention so long as the die and the contacts for connecting the package to external elements are simultaneously attached to the substrate.

Although only certain conventional integrated circuit package components have been described as being used with the novel method of he invention, it should be understood that the present invention may take on a wide variety of specific configurations using a variety of other conventional components and still remain within the scope of the present invention. Therefore, the present examples are to be considered as illustrative and not restrictive, and the invention is not to be limited to the details given herein, but may be modified within the scope of the appended claims.

What is claimed is:

1. An integrated circuit package comprising:
    a) a flip chip integrated circuit die having a first plurality of contacts for electrically connecting the die to other elements;
    b) a second plurality of contacts for electrically connecting the integrated circuit package to external elements;
    c) a substrate having a connecting arrangement for electrically connecting the first plurality of contacts on the die to the second plurality of contacts, the die and the second plurality of contacts being attaching to a first surface of the substrate such that the first plurality of contacts on the die are electrically connecting to the second plurality of contacts;
    d) a metal cap attached to the integrated circuit package such that the metal cap covers and protects the die, the metal cap being positioned such that a bottom lowermost surface of the metal cap is substantially in a common plane with a plane extending through a plurality of lowermost points on the second plurality of contacts, this configuration allowing the integrated circuit package to be attached to an external element with the bottom lowermost surface of the metal cap and the lowermost points of the second plurality of contacts all providing attachment points to the external element, the connection between the bottom lowermost surface of the metal cap and the external element providing a direct thermal path for dissipating heat away from the die.

2. An integrated circuit package according to claim 1 wherein the first and the second plurality of contacts are solder balls.

3. An integrated circuit package according to claim 1 wherein the substrate includes a heat conducting stiffener that supports the connecting arrangement on a first surface of the stiffener, the first plurality of contacts and the heat conducting stiffener providing a thermal path for dissipating heat away from the die.

4. An integrated circuit package according to claim 3 wherein the connecting arrangement includes a layer of electrically insulating material deposited on the first surface of the stiffener and a pattern of electrically conductive trances formed on the insulating layer.

5. An integrated circuit package according to claim 3 wherein the connecting arrangement includes a thin flex tap substrate supported on the first surface of the stiffener.

6. An integrated circuit package according to claim 1 wherein the integrated circuit package further includes a heat sink attached to a second surface of the stiffener.

7. An integrated circuit package according to claim 1 wherein the metal cap is positioned such that the metal cap is in substantially direct contact with the die.

8. An integrated circuit package according to claim 1 wherein a thermally conductive grease is used to improve the thermal connection between the die and the metal cap.

9. An integrated circuit package according to claim 1 wherein portions of the metal cap are soldered to the die.

10. An integrated circuit package comprising:

a flip chip integrated circuit die having a first plurality of contacts for electrically connecting the die to other elements;

a special plurality of contacts for electrically connecting the integrated circuit package to external elements;

a substrate having traces for electrically connecting the first plurality of contacts on the die to the second plurality of contacts, the die and the second plurality of contacts being attached to a first surface of the substrate such that the first plurality of contacts on the die are electrically connected to the second plurality of contacts;

a metal cap attached to the substrate such that the metal cap and the substrate cooperate to completely encase the die, the metal cap being positioned such that a bottom lowermost surface of the metal cap is substantially in a common plane with a plane extending through a plurality of lowermost points on the second plurality of contacts, this configuration allowing the integrated circuit package to be attached to an external element with the bottom lowermost surface of the metal cap and the lowermost points of the second plurality of contacts all providing attachment points to the external element, the connection between the bottom lowermost surface of the metal cap and the external element providing a direct thermal path for dissipating heat away from the die.

11. A package for a semiconductor device, comprising:

a substrate having a first surface and a second surface;

an interconnect pattern having a plurality of interconnects formed on the second surface of the substrate;

a semiconductor device having a contact surface with a plurality of contacts formed thereon and a heat transfer surface, the semiconductor device affixed to the second surface of the substrate such that the plurality of contacts are in electrical contact with the interconnects of the interconnect pattern formed on the second surface of the substrate;

a second plurality of contacts formed on the second surface of the substrate and electrically connected to the semiconductor device through the first plurality of contacts and the plurality of interconnects formed, the second plurality of contacts protruding outward from the substrate so as to define an attachment plane; and a metal cap attached to the heat transfer surface of the semiconductor device and affixed to the second surface of the substrate such that the substrate and the metal cap encase and protect the semiconductor device, the metal cap protruding outward from the substrate and being substantially co-planar with the attachment plane so that when the second plurality of contacts are used to attach the package to an external element, the metal cap provides a direct thermal path for dissipating heat from the semiconductor device to the external element.

* * * * *

UNITED STATES PATENT AND TRADEMARK OFFICE
CERTIFICATE OF CORRECTION

PATENT NO. : 6,362,530 B1 Page 1 of 1
DATED : March 26, 2002
INVENTOR(S) : Shaw Wei Lee and Hem P. Takiar It is certified that error appears in the above-identified patent and that said Letters Patent is hereby corrected as shown below:

Column 1,
Line 12, change "package" to -- packages --.
Line 27, change "slip" to -- flip --.

Column 2,
Line 36, before "forming", insert -- of --.
Line 56, change "attached" to -- attaching --.

Column 3,
Line 1, change "wit" to -- with --.

Column 4,
Line 40, change "wise" to -- wide --.

Column 5,
Line 57, change "being" to -- begin --.

Column 8,
Line 5, change "wit" to -- with --.
Line 14, after "may", insert -- be --.
Line 20, after "method", insert -- of --.
Line 35, change "he" to -- the --.

Column 9,
Line 19, change "trances" to -- traces --.
Line 21, change "tap" to -- tape --.
Line 39, change "special" to -- second --.

Signed and Sealed this

Twenty-eighth Day of January, 2003

JAMES E. ROGAN
*Director of the United States Patent and Trademark Office*